United States Patent
Cheng et al.

(10) Patent No.: US 9,908,203 B2
(45) Date of Patent: Mar. 6, 2018

(54) COMPOSITE SOLDER BALL, SEMICONDUCTOR PACKAGE USING THE SAME, SEMICONDUCTOR DEVICE USING THE SAME AND MANUFACTURING METHOD THEREOF

(71) Applicant: MEDIATEK Inc., Hsin-Chu (TW)

(72) Inventors: Tao Cheng, Zhubei (TW); Wen-Sung Hsu, Zhubei (TW); Shih-Chin Lin, Taoyuan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/420,140

(22) Filed: Jan. 31, 2017

(65) Prior Publication Data

US 2017/0136582 A1 May 18, 2017

Related U.S. Application Data

(63) Continuation of application No. 14/918,698, filed on Oct. 21, 2015, now Pat. No. 9,597,752.

(Continued)

(51) Int. Cl.
*H01L 25/10* (2006.01)
*B23K 35/02* (2006.01)
(Continued)

(52) U.S. Cl.
CPC ........ *B23K 35/0244* (2013.01); *B23K 35/262* (2013.01); *B23K 35/264* (2013.01);
(Continued)

(58) Field of Classification Search
CPC .................. B23K 35/0244; B23K 35/264; B23K 35/262; B23K 2201/40; H01L 23/49816;
(Continued)

(56) References Cited

U.S. PATENT DOCUMENTS 6,337,445 B1    1/2002 Abbott et al.
9,597,752 B2 *  3/2017 Cheng ................ B23K 35/0244
(Continued)

FOREIGN PATENT DOCUMENTS

JP    2007075856 A    3/2007
JP    2011029395       2/2011
(Continued)

OTHER PUBLICATIONS

EP Search Report dated Jul. 28, 2016 in EP application (No. 15193187.0-1555).

*Primary Examiner* — Roy Potter
(74) *Attorney, Agent, or Firm* — McClure, Qualey & Rodack, LLP

(57) ABSTRACT

A semiconductor package includes a first substrate, a second substrate, a composite solder ball and a first semiconductor component. The composite solder ball includes a core, an encapsulating layer and a barrier layer. The composite solder ball is disposed between the first substrate and the second substrate for electrically connecting the first substrate and the second substrate. The barrier layer is disposed between the core and the encapsulating layer. Wherein a melting point of the barrier layer is higher than a melting point of the core, the melting point of the core is higher than a melting point of the encapsulating layer. The first semiconductor component is disposed between the first substrate and the second substrate.

18 Claims, 7 Drawing Sheets

Related U.S. Application Data

(60) Provisional application No. 62/132,683, filed on Mar. 13, 2015.

(51) Int. Cl.
*H01L 23/498* (2006.01)
*B23K 35/26* (2006.01)
*B23K 101/40* (2006.01)

(52) U.S. Cl.
CPC .. *H01L 23/49816* (2013.01); *H01L 23/49866* (2013.01); *H01L 23/49894* (2013.01); *H01L 25/105* (2013.01); *B23K 2201/40* (2013.01); *H01L 2225/1023* (2013.01); *H01L 2225/1041* (2013.01); *H01L 2225/1058* (2013.01)

(58) Field of Classification Search
CPC ............. H01L 25/105; H01L 23/49866; H01L 23/49894; H01L 2225/1023; H01L 2225/1041; H01L 2225/1058; H01L 2924/15311; H01L 2924/0105; H01L 2224/48247; H01L 2924/014
See application file for complete search history.

(56) References Cited

U.S. PATENT DOCUMENTS

| | | | |
|---|---|---|---|
| 2006/0071330 | A1 | 4/2006 | Suminoe et al. |
| 2009/0256256 | A1 | 10/2009 | Meyer |
| 2010/0084765 | A1 | 4/2010 | Lee et al. |
| 2011/0156264 | A1 | 6/2011 | Machida |
| 2014/0124925 | A1 | 5/2014 | Sidhu et al. |
| 2015/0313025 | A1 | 10/2015 | Kawasaki et al. |
| 2016/0005504 | A1 | 1/2016 | Ishida et al. |
| 2016/0148885 | A1 | 5/2016 | Kawasaki et al. |

FOREIGN PATENT DOCUMENTS

| | | |
|---|---|---|
| JP | 5408401 B1 | 2/2014 |
| JP | 5435182 B1 | 3/2014 |
| JP | 5585750 B1 | 9/2014 |

\* cited by examiner

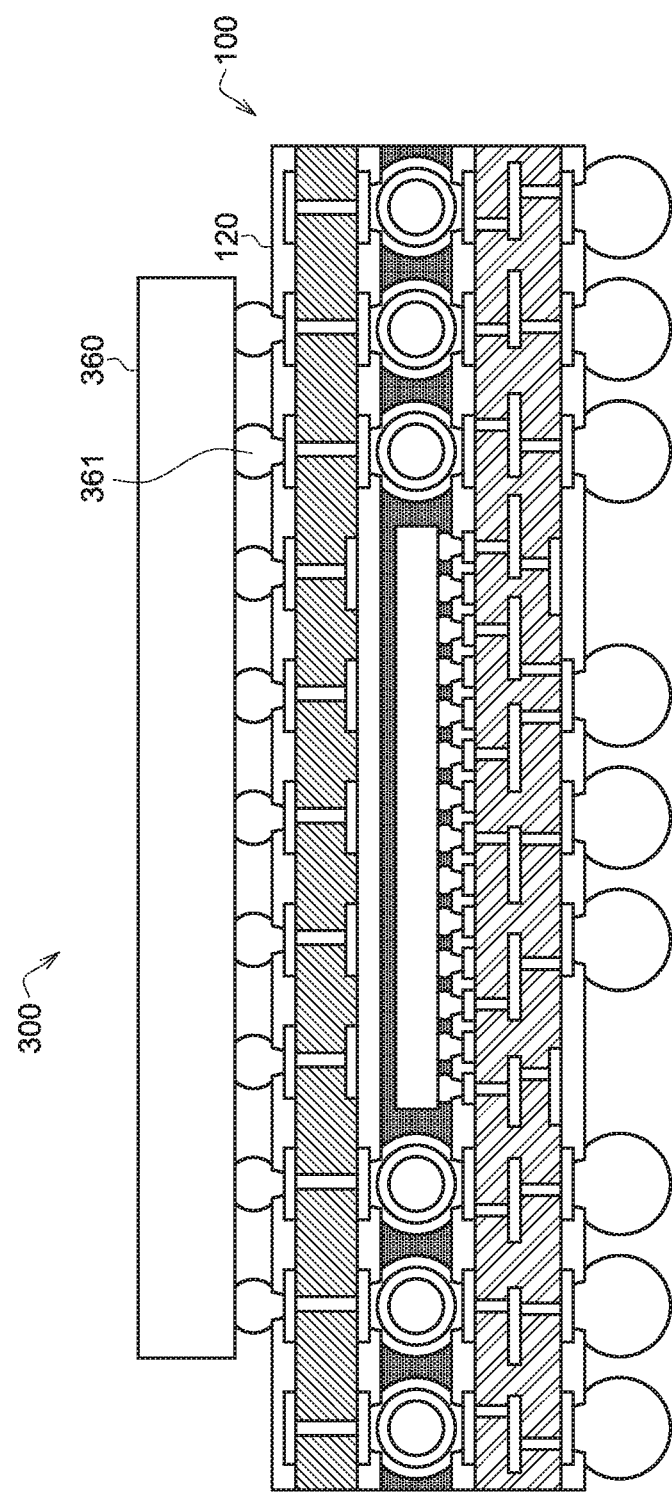

COMPOSITE SOLDER BALL, SEMICONDUCTOR PACKAGE USING THE SAME, SEMICONDUCTOR DEVICE USING THE SAME AND MANUFACTURING METHOD THEREOF

This application is a continuation application (CA) of U.S. application Ser. No. 14/918,698, filed on Oct. 21, 2015, which claimed the benefit of U.S. Provisional application Ser. No. 62/132,683, filed Mar. 13, 2015. The entire disclosures of U.S. application Ser. No. 14/918,698 and provisional application Ser. No. 62/132,683 are incorporated herein by reference.

FIELD OF THE INVENTION

The invention relates to a solder ball, a semiconductor package using the same, a semiconductor device using the same and a manufacturing method thereof, and more particularly to a composite solder ball, a semiconductor package using the same, a semiconductor device using the same and a manufacturing method thereof.

BACKGROUND OF THE INVENTION

In the electronics industry, high integration and multiple functions with high performance become essential for new products. And meanwhile, high integration may cause higher manufacturing cost, since the manufacturing cost is in proportional to its size. Therefore, demanding on miniaturization of integrated circuit (IC) packages has become more and more critical.

Package-on-package (PoP) is now the fastest growing semiconductor package technology since it is a cost-effective solution to high-density system integration in a single package. In a PoP structure, various packages are integrated in a single semiconductor package to reduce the size. Accordingly, there exists a need to provide a semiconductor package to overcomes, or at least reduces the above-mentioned problems.

Therefore, it is important to increase the performance of the 3D graphic processing circuit while reducing the consumption of the electric power and extending the operating time of the mobile device.

SUMMARY OF THE INVENTION

In one embodiment of the invention, a composite solder ball is provided. The composite solder ball includes a core, an encapsulating layer and a barrier layer. The barrier layer is disposed between the core and the encapsulating layer. Wherein a melting point of the barrier layer is higher than a melting point of the core, the melting point of the core is higher than a melting point of the encapsulating layer.

In another embodiment of the invention, a semiconductor package is provided. The semiconductor package includes a first substrate, a second substrate, a composite solder ball and a first semiconductor component. The composite solder ball includes a core, an encapsulating layer and a barrier layer. The composite solder ball is disposed between the first substrate and the second substrate for electrically connecting the first substrate and the second substrate. The barrier layer is disposed between the core and the encapsulating layer. Wherein a melting point of the barrier layer is higher than a melting point of the core, the melting point of the core is higher than a melting point of the encapsulating layer. The first semiconductor component is disposed between the first substrate and the second substrate.

In another embodiment of the invention, a semiconductor device is provided. The semiconductor device includes a semiconductor package and a second semiconductor component. The second semiconductor component is disposed on the second substrate of the semiconductor package. The semiconductor package includes a first substrate, a second substrate, a composite solder ball and a first semiconductor component. The composite solder ball includes a core, an encapsulating layer and a barrier layer. The composite solder ball is disposed between the first substrate and the second substrate for electrically connecting the first substrate and the second substrate. The barrier layer is disposed between the core and the encapsulating layer. Wherein a melting point of the barrier layer is higher than a melting point of the core, the melting point of the core is higher than a melting point of the encapsulating layer. The first semiconductor component is disposed between the first substrate and the second substrate.

In another embodiment of the invention, a manufacturing method of a semiconductor package is provided. The manufacturing method includes the following steps. A first substrate is provided; a first semiconductor component is disposed on the first substrate; a second substrate is provided; a plurality of composite solder balls are disposed on the second substrate; the first substrate is connected to the second substrate by way of the composite solder balls facing the first substrate, wherein the composite solder balls are disposed between the first substrate and the second substrate.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which:

FIG. 3 illustrates a diagram of a semiconductor device according to another embodiment of the invention;

DETAILED DESCRIPTION OF PREFERRED EMBODIMENTS

Figure 1:
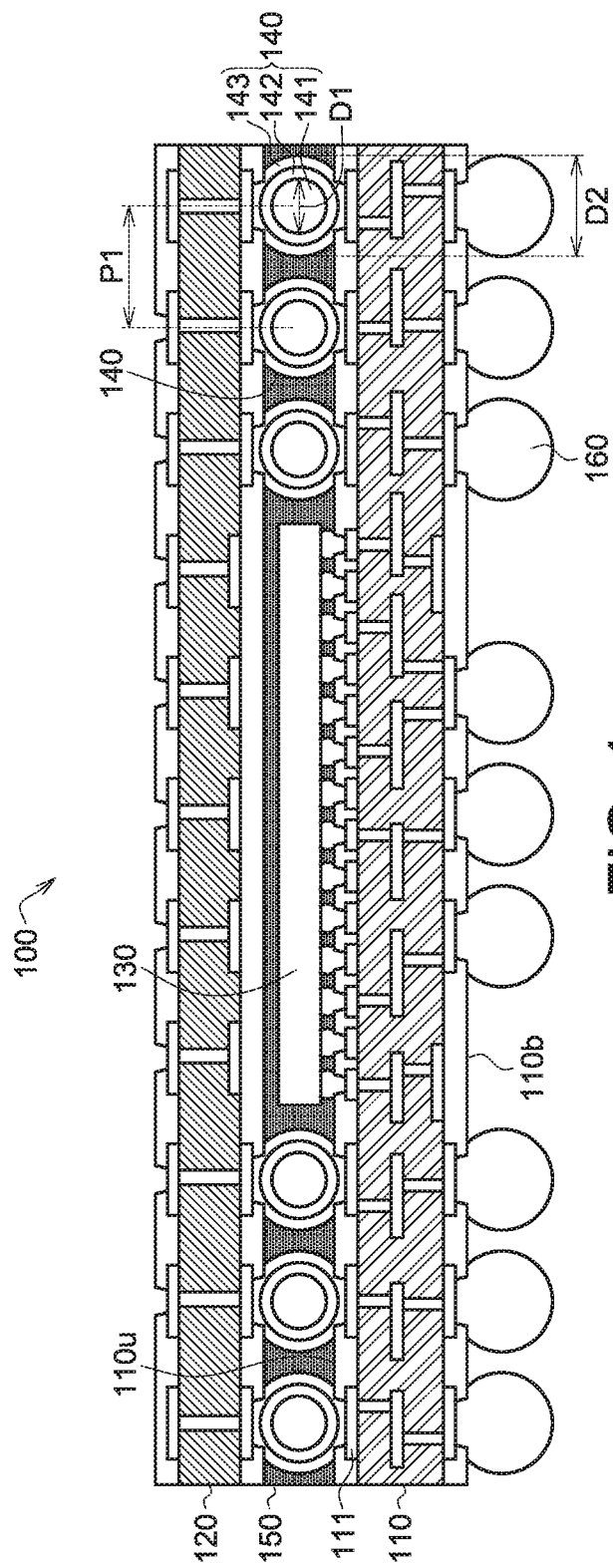
FIG. 1 illustrates a diagram of a semiconductor package according to an embodiment of the invention.

FIG. 1 illustrates a diagram of a semiconductor package 100 according to an embodiment of the invention. The semiconductor package 100 includes a first substrate 110, a second substrate 120, a first semiconductor component 130, a plurality composite solder balls 140, a package body 150 and a plurality of conductive contacts 160.

The first substrate 110 is, for example, a multi-layered coreless substrate. The first substrate 110 includes a plurality of pads 111 for electrically connected to the composite solder balls 140. The second substrate 120 is, for example, an interposer.

The first semiconductor component 130 may be disposed on and electrically connected to the first substrate 110 through the composite solder balls 140. The second substrate 120 may be electrically connected to the first semiconductor component 130 through the composite solder balls 140 and the second substrate 120.

In the present embodiment, the first semiconductor component 130 is coupled to an upper surface 110u of the first substrate 110 in a "face-down" orientation and electrically connected to the first substrate 110 via a plurality of conductive contacts 131. This configuration is sometimes referred to as "flip-chip". The conductive contact 131 may be solder ball, conductive pillar, etc.

In other embodiments, the first semiconductor component 130 may be coupled to the first substrate 110 in a "face-up" orientation, and electrically connected to the first substrate 110 via a plurality of conductive bond wires (not shown). The first semiconductor component 130 may be an active chip or a passive component, such as a resistor, an inductor or a capacitor. In another embodiment, the number of the first semiconductor component 130 may be several.

Each composite solder ball 140 includes a core 141, a barrier layer 142 and an encapsulating layer 143. The barrier layer 142 is disposed between the core 141 and the encapsulating layer 143. For example, the barrier layer 142 directly or indirectly encapsulates the core 141, and the encapsulating layer 143 directly or indirectly encapsulates the barrier layer 142.

The melting point of the core 141 may be higher than the melting point of the encapsulating layer 143, such that the core 141 may be prevented from melting and deforming during reflow process, Therefore, it is possible to prevent an outer diameter D1 of the core 141 from expanding, and accordingly the minimum interval P1 between adjacent two composite solder balls 140 do not be narrowed, such that adjacent two composite solder balls 140 may be prevented from being electrically short to each other, and the density of the composite solder balls 140 may be increased.

In one embodiment, the core 141 may be made of a material including tin, bismuth or a combination thereof. In another embodiment, the core 141 may be made of a material in absence of copper. As a result, the outer diameter D1 of the core 141 may be reduced, such that the outer diameter D2 of the encapsulating layer 143 encapsulating the core 141 may be reduced and/or the thickness of the semiconductor package 100 may be reduced. In one embodiment, after reflow, the encapsulating layer 143 has the outer diameter D2 ranging between 120 μm and 130 μm.

In addition, the melting point of the barrier layer 142 may be higher than the melting point of the core 141, such that the barrier layer 142 can restrict the outer diameter D1 of the core 141 and accordingly can prevent the core 141 from over-deforming during reflow process. Furthermore, since the barrier layer 142 can restrict the outer diameter D1 of the core 141, the core 141 may be made a material having hardness and/or strength lower than that of the barrier layer 142. For example, the barrier layer 142 may be made of a material including nickel whose hardness and/or strength is larger than the core 141.

In addition, the encapsulating layer 143 may be pre-solder. Under such design, the semiconductor package 100 may omit extra pre-solder which is pre-applied on the first substrate 110 and/or the second substrate 120. In one embodiment, the encapsulating layer 143 may be made of an alloy material including at least two of tin, silver and copper.

The package body 150 is formed between the first substrate 110 and the second substrate 120 and encapsulates the first semiconductor component 130 and the composite solder balls 140.

The package body 150 can include, for example, a Novolac-based resin, an epoxy-based resin, a silicone-based resin, or another suitable encapsulant. Suitable fillers also can be included, such as powdered SiO2.

The conductive contacts 160 are disposed on a bottom surface 110b of the first substrate 110. The semiconductor package 100 is disposed on and electrically connected to an exterior circuit, such as a circuit board. The conductive contact 160 may be solder ball, conductive pillar, etc.

Figure 2:
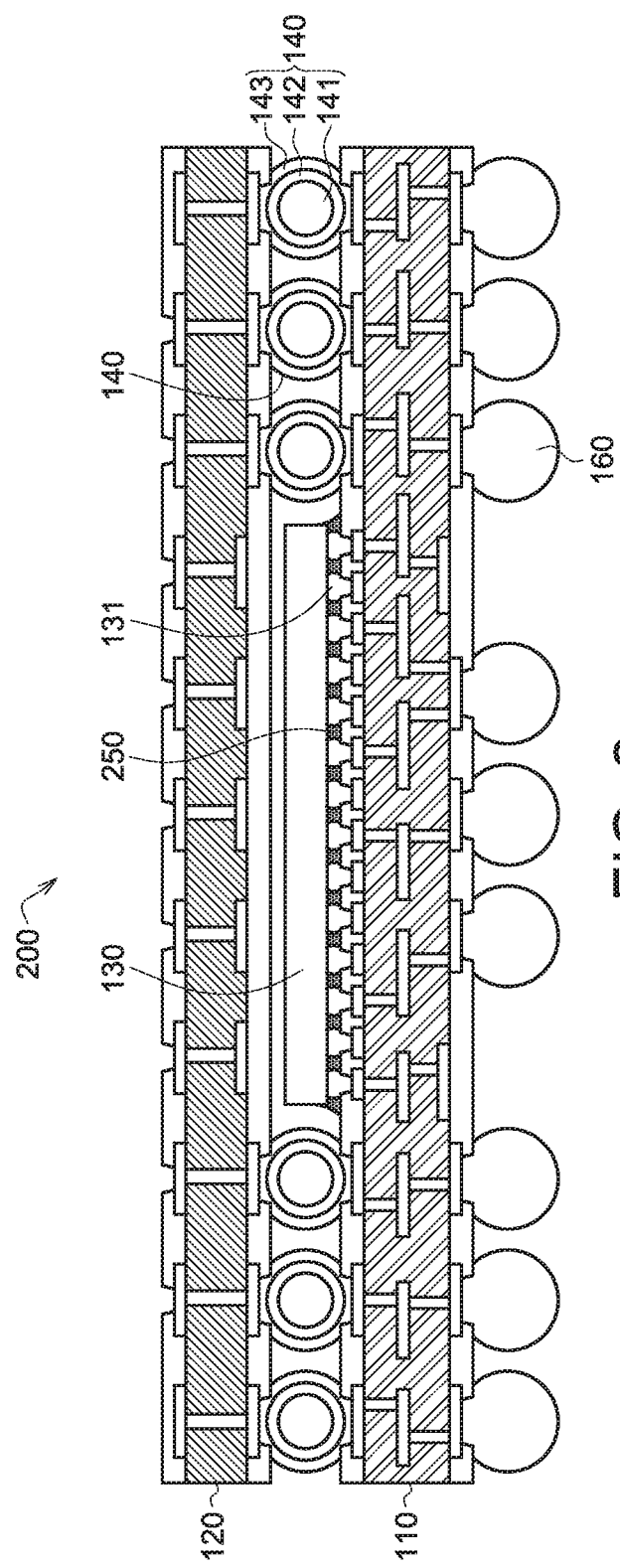
FIG. 2 illustrates a diagram of a semiconductor package according to another embodiment of the invention.

FIG. 2 illustrates a diagram of a semiconductor package 200 according to another embodiment of the invention. The semiconductor package 200 includes the first substrate 110, the second substrate 120, the first semiconductor component 130, the composite solder balls 140, an under fill 250 and a plurality of conductive contacts 160.

The under fill 250 is formed between the first semiconductor component 130 and the first substrate 110 and encapsulates a plurality of conductive contacts 131 of the first semiconductor component 130.

In the present embodiment, the semiconductor package 200 omits the package body 150. In another embodiment, the semiconductor package 200 may further includes the package body 150 encapsulating the first semiconductor component 130, the composite solder balls 140 and the under fill 250.

FIG. 3 illustrates a diagram of a semiconductor device 300 according to another embodiment of the invention. The semiconductor device 300 includes a semiconductor package 100 and a second semiconductor component 360. The second semiconductor component 360 may be, for example, a memory, a semiconductor component rather than memory, another semiconductor package, active component, passive component, etc. The second semiconductor component 360 is disposed on and electrically connected to the second substrate 120 of the semiconductor package 100 through a plurality of conductive contacts 361. The conductive contact 361 may be solder ball, pillar, etc.

FIGS. 4A to 4F illustrate manufacturing processes of the semiconductor package 100 of FIG. 1.

Figure 4A:
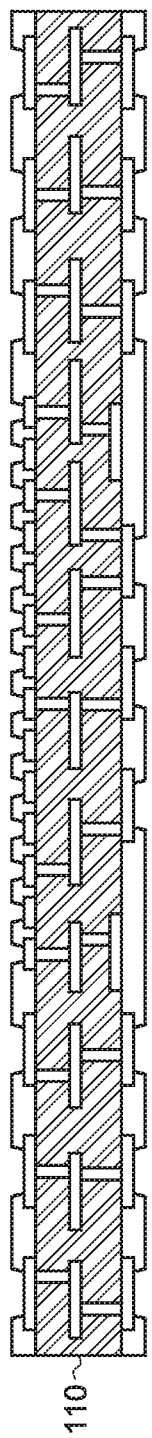
FIGS. 4A to 4F illustrate manufacturing processes of the semiconductor package of FIG. 1.

Referring to FIG. 4A, the first substrate 110 is provided.

Figure 4B:
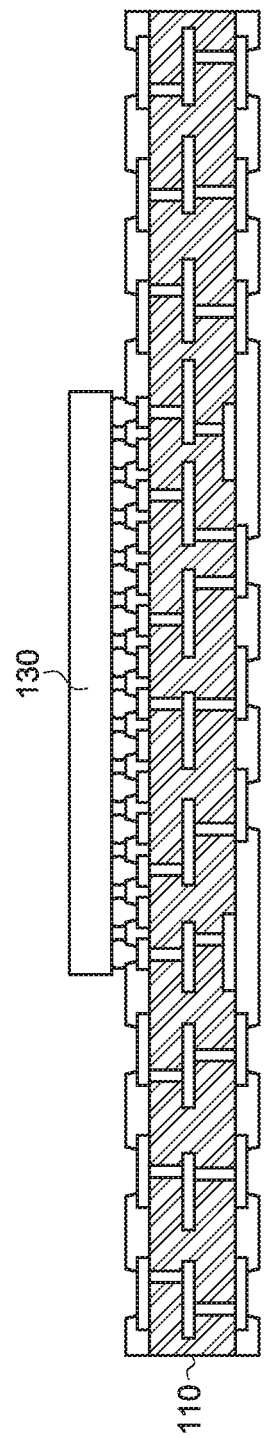

Referring to FIG. 4B, the first semiconductor component 130 is disposed on the first substrate 110 using, for example, surface mount technology (SMT).

Figure 4C:
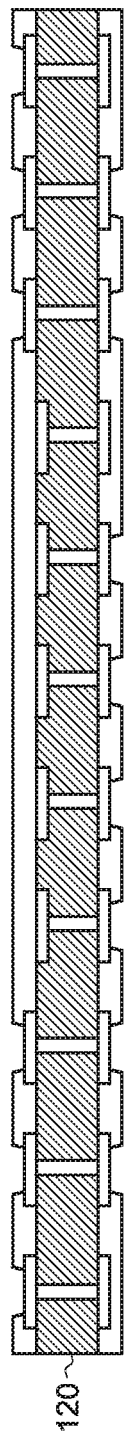

Referring to FIG. 4C, the second substrate 120 is provided.

Figure 4D:
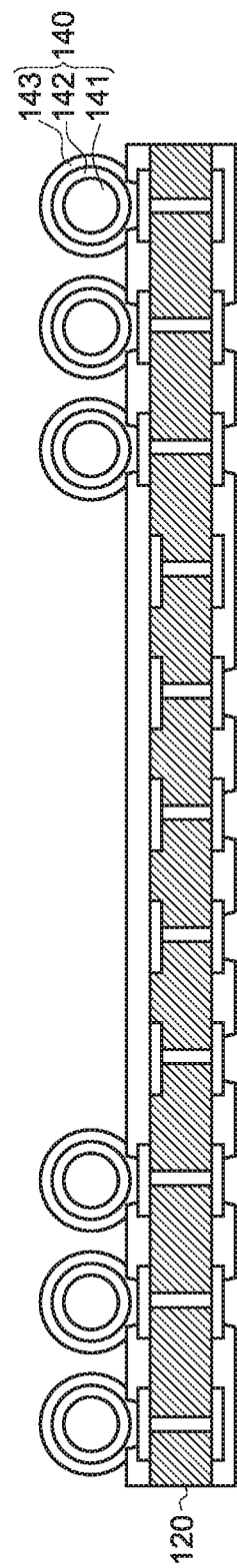

Referring to FIG. 4D, a plurality of composite solder balls 140 are disposed on the second substrate 120 using, for example, ball mounting technology. Each composite solder ball 140 includes the core 141, the barrier layer 142 and the encapsulating layer 143. The barrier layer 142 is disposed between the core 141 and the encapsulating layer 143. For example, the barrier layer 142 directly or indirectly encapsulates the core 141, and the encapsulating layer 143 directly or indirectly encapsulates the barrier layer 142.

Figure 4E:
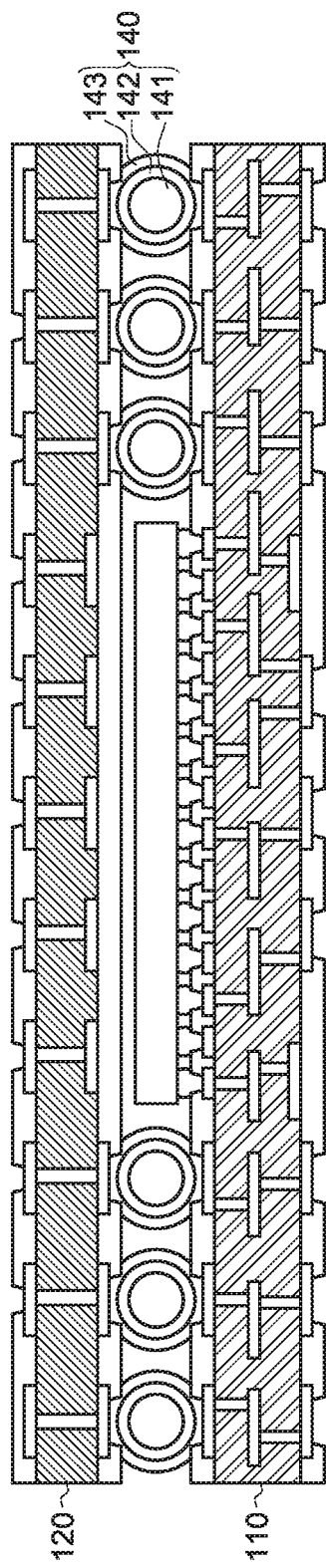

Referring to FIG. 4E, the first substrate 110 is connected to the second substrate 120 by way of the composite solder balls 140 facing the first substrate 110, wherein the composite solder balls 140 are disposed between the first substrate 110 and the second substrate 120 for electrically connecting the first substrate 110 and the second substrate 120.

After reflow process, the encapsulating layer 143 of the composite solder balls 140 is melted to solder with the pads 111 of the first substrate 110. Since the melting point of the core 141 is higher than the melting point of the encapsulating layer 143, the reflowing temperature may be sufficiently high. For example, the reflowing temperature may reach 245° C. or higher, such that the encapsulating layer 143 can firm formed on the pads 111 of the first substrate 110, and the core 141 may be prevented from melting and/or over-deforming. In another embodiment, the reflowing temperature may approach or exceed the melting point of the core 141.

In addition, the melting point of the barrier layer 142 is higher than the melting point of the core 141, such that, during reflow process, the barrier layer 142 can restrict the outer diameter D1 of the core 141 and accordingly can prevent the core 141 from over-deforming.

Figure 4F:
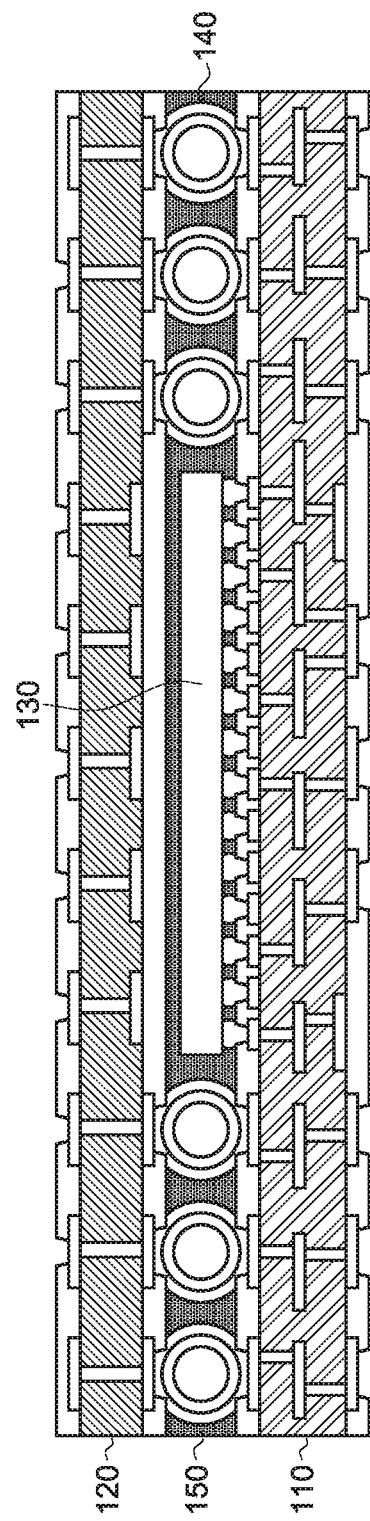

Referring to FIG. 4F, the package body 150 is disposed over the upper surface 110u of the first substrate 110 and encapsulates the first semiconductor component 130. The package body 150 can be formed by various packaging technologies, such as, for example, compression molding, injection molding, transfer molding or dispensing technology.

Then, the conductive contacts 160 of FIG. 1 may be disposed on the bottom surface of 110b of the first substrate 110 of FIG. 1 so as to form the semiconductor package 100 as illustrated in FIG. 1.

Figure 5:
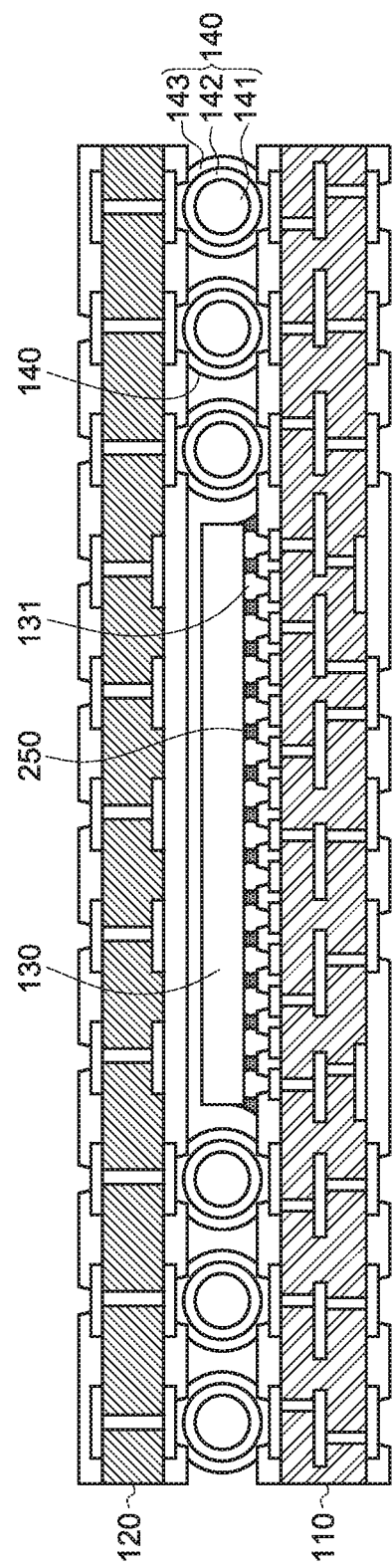
FIG. 5 illustrates a manufacturing process of the semiconductor package of FIG. 2.

FIG. 5 illustrates a manufacturing process of the semiconductor package 200 of FIG. 2. The under fill 250 is formed between the first substrate 110 and the first semiconductor component 130 and encapsulates the conductive contacts 131 using, for example, dispensing technology. In addition, the other formation steps of the semiconductor package 200 are similar to the corresponding steps of the semiconductor package 100 of FIG. 1, and the similarities are not repeated here.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A composite solder ball, comprising:
   a core, containing a material of metal;
   an encapsulating layer; and
   a barrier layer disposed between the core and the encapsulating layer;
   wherein a melting point of the barrier layer is higher than a melting point of the core, and the melting point of the core is higher than a melting point of the encapsulating layer;
   wherein the encapsulating layer has an outer diameter ranging between 120 micrometers and 130 micrometers.

2. The composite solder ball as claimed in claim 1, wherein the core is made of tin, bismuth or a combination thereof.

3. The composite solder ball as claimed in claim 1, wherein the encapsulating layer is made of an alloy material including at least two of tin, silver and copper.

4. A semiconductor package, comprising:
   a first substrate;
   a second substrate;
   a composite solder ball as claimed in claim 1, disposed between the first substrate and the second substrate for electrically connecting the first substrate and the second substrate; and
   a first semiconductor component, disposed between the first substrate and the second substrate.

5. The semiconductor package as claimed in claim 4, wherein the encapsulating layer has an outer diameter ranging between 120 micrometers and 130 micrometers.

6. The semiconductor package as claimed in claim 4, wherein the core is made of tin, bismuth or a combination thereof.

7. The semiconductor package as claimed in claim 4, wherein the encapsulating layer is made of an alloy material including at least two of tin, silver and copper.

8. The semiconductor package as claimed in claim 1, wherein the second substrate is an interposer.

9. A semiconductor device, comprising:
   a semiconductor package as claimed in claim 4; and
   a second semiconductor component, disposed on the second substrate of the semiconductor package.

10. The semiconductor device as claimed in claim 9, wherein the encapsulating layer has an outer diameter ranging between 120 micrometers and 130 micrometers.

11. The semiconductor device as claimed in claim 9, wherein the core is made of tin, bismuth or a combination thereof.

12. The semiconductor device as claimed in claim 9, wherein the encapsulating layer is made of an alloy material including at least two of tin, silver and copper.

13. The semiconductor device as claimed in claim 9, wherein the second substrate is an interposer.

14. The semiconductor device as claimed in claim 9, wherein the second semiconductor component is a memory device.

15. A manufacturing method of a semiconductor package, comprising:
   providing a first substrate;
   disposing a first semiconductor component on the first substrate;
   providing a second substrate;
   disposing a plurality of composite solder balls on the second substrate;
   connecting the first substrate and the second substrate by way of the composite solder balls facing the first substrate, wherein the composite solder balls are disposed between the first substrate and the second substrate;
   wherein the encapsulating layer has an outer diameter ranging between 120 micrometers and 130 micrometers.

16. The manufacturing method as claimed in claim 15, wherein the core is made of tin, bismuth or a combination thereof.

17. The manufacturing method as claimed in claim 15, wherein the encapsulating layer is made of an alloy material including at least two of tin, silver and copper.

18. The manufacturing method as claimed in claim 15, wherein the second substrate is an interposer.

* * * * *